(12) United States Patent
Kalai et al.

(10) Patent No.: US 9,665,666 B1
(45) Date of Patent: May 30, 2017

(54) GRAPH BASED ROUTING FOR OPEN AREAS

(71) Applicant: Google Inc., Mountain View, CA (US)

(72) Inventors: Iljya Kalai, Zurich (CH); Manuel Bellido, Arequipa (PE); Ivaylo Strandzhev, Sofia (BG)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/700,553

(22) Filed: Apr. 30, 2015

Related U.S. Application Data

(63) Continuation of application No. 13/651,046, filed on Oct. 12, 2012, now Pat. No. 9,047,422.

(51) Int. Cl.
*G06F 17/50* (2006.01)

(52) U.S. Cl.
CPC ................... *G06F 17/50* (2013.01)

(58) Field of Classification Search
None
See application file for complete search history.

(56) References Cited

U.S. PATENT DOCUMENTS

| | | |
|---|---|---|
| 6,934,615 B2 | 8/2005 | Flann et al. |
| 7,079,943 B2 | 7/2006 | Flann et al. |
| 8,498,788 B2 | 7/2013 | Kondekar |
| 2005/0197757 A1 | 9/2005 | Flann et al. |
| 2006/0224304 A1* | 10/2006 | Hudson, Jr. ............ G01C 21/00 701/433 |
| 2010/0023249 A1 | 1/2010 | Mays et al. |
| 2010/0023251 A1 | 1/2010 | Gale et al. |
| 2010/0088011 A1 | 4/2010 | Bruce et al. |
| 2011/0080848 A1 | 4/2011 | Khorashadi et al. |
| 2011/0082638 A1 | 4/2011 | Khorashadi et al. |
| 2011/0087431 A1 | 4/2011 | Gupta et al. |
| 2011/0172906 A1 | 7/2011 | Das et al. |
| 2012/0016872 A1 | 1/2012 | Khorashadi et al. |
| 2012/0044265 A1 | 2/2012 | Khorashadi et al. |
| 2013/0035110 A1 | 2/2013 | Sridhara et al. |
| 2013/0096885 A1 | 4/2013 | Gupta |
| 2013/0191019 A1 | 7/2013 | Pakzad |
| 2013/0238234 A1 | 9/2013 | Chao et al. |
| 2013/0345967 A1 | 12/2013 | Pakzad |

* cited by examiner

*Primary Examiner* — John R Olszewski
*Assistant Examiner* — James M McPherson
(74) *Attorney, Agent, or Firm* — Lerner, David, Littenberg, Krumholz & Mentlik, LLP

(57) ABSTRACT

A system and method determines a path in an open space that does not have a well-structured routing infrastructure. In some embodiments, the system and method may model the open space with one-dimensional segments. The system and method may determine a path between two points along the one-dimensional segments. In some embodiment, the system and method may smooth the path based on geometry of objects in the open space.

20 Claims, 17 Drawing Sheets

GRAPH BASED ROUTING FOR OPEN AREAS

CROSS-REFERENCE TO RELATED APPLICATIONS

The present application is a continuation of U.S. patent application Ser. No. 13/651,046, filed Oct. 12, 2012, the disclosure of which is incorporated herein by reference.

BACKGROUND OF THE INVENTION

An open space often lacks a well-structured walking network defined by sidewalks, roads or other paths. Examples of such open space may include an indoor space, town square, park, parking lot, mountain, and a tract of water. Such open space may be modeled by a graph-based infrastructure, but without concrete paths defined therein.

A user, such as a pedestrian, hiker, biker, swimmer, or driver of a vehicle, often needs directions or suggestions of a path when maneuvering in the open space. Such path is an unobstructed path that obviates obstacles in the open space. An obstacle may be an object that stands in the way of a user, or prevents the user from maneuvering forward. Sometimes, a user needs to travel from a well-structured walking network to an open space in a seamless fashion, such that the user may receive continuous direction or path finding support when maneuvering from the walking network to the open space.

However, existing path finding processes fail to meet the user's needs for various reasons. For instance, some processes depend on a well-structured walking network in order to compute directions or determine a walking path. Some other processes are not compatible with the graph-based infrastructure. Other processes provide a user with a jagged, unnatural or ugly path that the user is unlikely to remember or unlikely to undertake under normal circumstances.

BRIEF SUMMARY OF THE INVENTION

The present technology relates to a system, apparatus, and method for finding an unobstructed path between two points in an open space, such as an indoor space, that avoids obstacles in the space.

Aspects of the present technology include a method for finding a route in an open space. The open space may not be predefined with a walking infrastructure. The open space may include one or more objects or obstacles therein. The method may include receiving information of the open space. A processor may partition the open space with a plurality of partition lines based on a geometric arrangement of one or more objects in the open space. The processor may determine a path along the partition lines, unobstructed by objects, between two points in the open space. In one example, the processor may smooth the path.

Another aspect of the present technology includes a method for determining a path in an open space. The method may include receiving a path between a first point and a second point in the open space. The method may also include receiving geometry information of one or more objects or obstacles in the open space. A processor may smooth the path using the geometry information.

In one example, the processor may smooth the path by generating another path taut around the geometry of the objects in the open space. In another example, the processor may smooth the path by creating a plurality of sample points along the path. The processor may create a cord vector, and add first and last sample points to the cord vector. The processor may cast a ray from a latest addition to the cord vector to each sample point, determine whether the ray intersects with any object, and add an intersection point between the ray and the objects to the cord vector.

A further aspect of the present technology includes a method for determining a path in an open space. The method may include retrieving information of an open space. A processor may model the open space with one-dimensional segments. The processor may determine a path between first and second points along the one-dimensional segments, and smooth the path. In one example, the processor may smooth the path using the Cords algorithm.

A still further aspect of the present technology includes a system for determining a path in an open space. The system may include a memory and a processor in communication with the memory. The memory may store information about a geometric arrangement of one or more objects in the open space. The processor may be configured to partition the open space with a plurality of partition lines based on the geometric arrangement. The processor may determine a path between first and second points along the partition lines.

Another aspect of the present technology includes a system for determining a path in an open space. The system may include a memory and a processor in communication with the memory. The memory may store geometry information of one or more objects in the open space. The processor may be configured to receive a path between two points in the open space. The processor may smooth the path using the geometry information.

Various aspects of the described example embodiments may be combined with aspects of certain other example embodiments to realize yet further embodiments. It is to be understood that one or more features of any one example may be combined with one or more features of the other examples. In addition, any single feature or combination of features in any example or examples may constitute patentable subject matter.

Other features of the technology will be apparent from consideration of the information contained in the following detailed description.

BRIEF DESCRIPTION OF THE DRAWINGS

The accompanying drawings, which are incorporated in and constitute a part of this specification, illustrate embodiments of the present disclosure and, together with the detailed description of the embodiments given below, serve to explain the principles of the disclosure.

DETAILED DESCRIPTION

Figure 1:
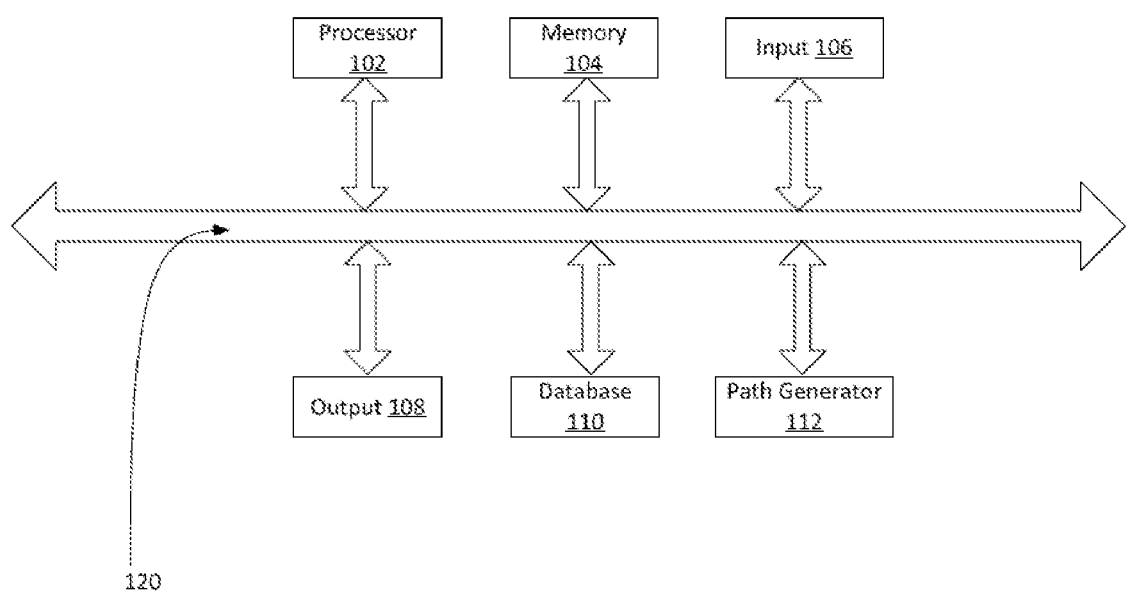
FIG. 1 shows an example system of the present technology.

For simplicity and clarity of illustration, like reference numerals may be used in the drawings to identify identical or analogous structural elements.

Flow diagrams are used in the drawings to illustrate processes, operations, or methods performed by components, devices, parts, systems, or apparatuses disclosed herein. The flow diagrams are mere exemplary illustrations of steps or operations performed in individual processes, operations or methods, such as by a suitable configured controller or processor. The processes may be performed in the precise order as illustrated in the flow diagrams. Alternatively, various steps may be handled simultaneously or performed in sequences different from that illustrated. Steps may also be omitted from or added to the flow diagrams unless otherwise stated.

As illustrated in FIG. 1, example embodiments of the present technology may include a system 100. The system 100 may be, but not limited to, a server, a full-sized personal computer, or a mobile device such as a tablet PC, notebook, a cellular phone, or a PDA.

FIG. 1 is a block diagram illustrating an example bus configuration of the system 100. As shown in FIG. 1, the system 100 may include one or more of the following components: a processor 102, a memory 104, an input device 106, an output device 108, a database 110 of open spaces, and a path generator 112. One or more of these components may be operatively connected with each other via wireless communication, physical coupling and/or electrical coupling, such as with a bus 120. One or more of these components may transmit or receive executable instructions in analog or digital signals to or from one or more of other components. Details with respect to each component are given below.

The processor 102 may be configured to control operation of the processes related to the system 100. The processor 102 may refer to a single processor or a collection of processors including one or more of the following: central processing unit (CPU), microprocessor, digital signal processor, front end processor, coprocessor, data processor, and/or analog signal processor. The processor 102 may be implemented with one or more application specific integrated circuits (ASICs). In one aspect, the system 100 as a whole may have a processor 102 to perform acts of each component described herein in accordance with programmable instructions executed by the processor 102. Alternatively, one or more individual components of the system 100, e.g., input device 106, output device 108, may each have its own processor configured to execute component-specific instructions.

In some aspects, the processor 102 may be physically mounted within the system 100. Alternatively, the processor 102 may be located remotely from the system 100, and may communicate with the system 100 via a network (not shown). When there are a collection of processors, one or more processors may be physically mounted within the system 100, while the remaining processors may communicate remotely with the system 100 via a network.

The memory 104 may store programmable instructions executed by the processor 102. The memory 104 may include a volatile memory, a non-volatile memory, or a combination thereof. The volatile memory may include a RAM, such as a dynamic random access memory (DRAM) or static random access memory (SRAM), or any other forms of alterable memory that may be electrically erased and reprogrammed. The non-volatile memory may include a ROM, a programmable logical array, or other forms of non-alterable memory which cannot be modified, or can be modified only slowly or with difficulty. The non-volatile memory may include firmware.

The input device 106 may facilitate user operation of the system 100. A user of the system 100 may be, but not limited to, one of the following: an operator, pedestrian, hiker, biker, swimmer, driver, or automotive vehicle. The input device 106 may include, but not limited to, a keyboard, touch panel, control buttons, mouse, trackpad and switch. Such an input device 106 may be implemented to accept inputs entered by a user such as the user's starting and ending points in an open space or the user's points of interest in the open space.

The output device 108 may include, but not limited to, a display or a printer. The display may be a monitor or LCD panel. The display may display an indoor space or other area of interest. The display may also display a path between the user's starting and ending points or between points of interest, where the path is determined according to processes described herein.

Figure 2:
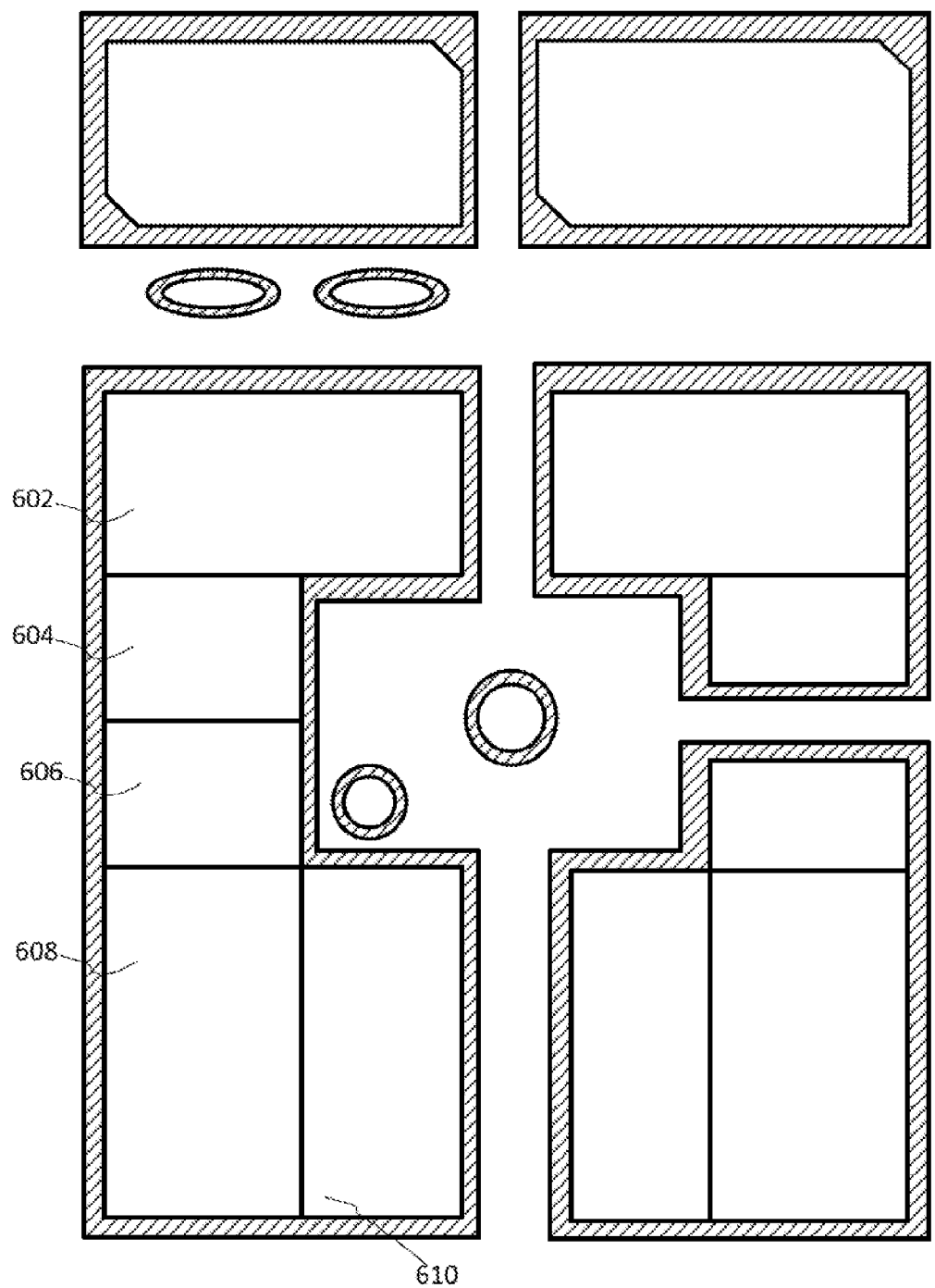
FIG. 2 is a block diagram of an example floor plan.

In one aspect, the system 100 may temporarily or permanently store information related to a plurality of open spaces in a database 110. The database 110 may be a relational database. In one example, information stored therein may include visual or textual representations of open spaces, such as images. An image may be a two-dimensional top-down view of an open space, e.g., a floor plan of an indoor space, as illustrated in FIG. 2. Alternatively, the image may be a three-dimensional terrain image of the open space.

Images may be stored in one or more of the following formats: compressed or uncompressed, lossless (e.g., BMP) or lossy (e.g., JPEG), and bitmap or vector-based (e.g., SVG), as well as computer instructions for drawing graphics. Each image may comprise any information sufficient to identify objects in an open space. An object may be an obstacle such as a wall, furniture, fountain, building or other physical barrier that causes an obstruction in the open space.

The database 110 may also store therein qualities or physical attributes of real-world objects positioned in the open spaces. For instance, physical attributes of an object may include one or more of the following: width, length, thickness, elevation, shape, geolocation including longitude and latitude, and relative position of the object in the open space.

As illustrated in FIG. 2, the database 110 may store a floor plan 200 that records information of objects in an indoor space. In FIG. 2, objects, or more specifically obstacles 602-610, in the indoor space may be represented by various geometric shapes. The geometric shapes generally conform to contours or boundaries of the obstacles. In FIG. 2, such geometries are shown to include, but are not limited to, polygons, circles, and ellipses. Also shown in FIG. 2, arrangements of the obstacles relative to each other in the open space may be drawn to scale.

In some aspects, the system 100 may temporarily or permanently store graphs of the open spaces described above in the memory 104.

Returning back to FIG. 1, the path generator 112 may implement processes to determine a path in an open space. The processes may be implemented in programmable instructions executable by the processor 102. The programmable instructions may be stored in the memory 104, such as firmware, or a data storage (not shown) of the system 100 or may otherwise be implemented as one or more ASICs.

Figure 3:
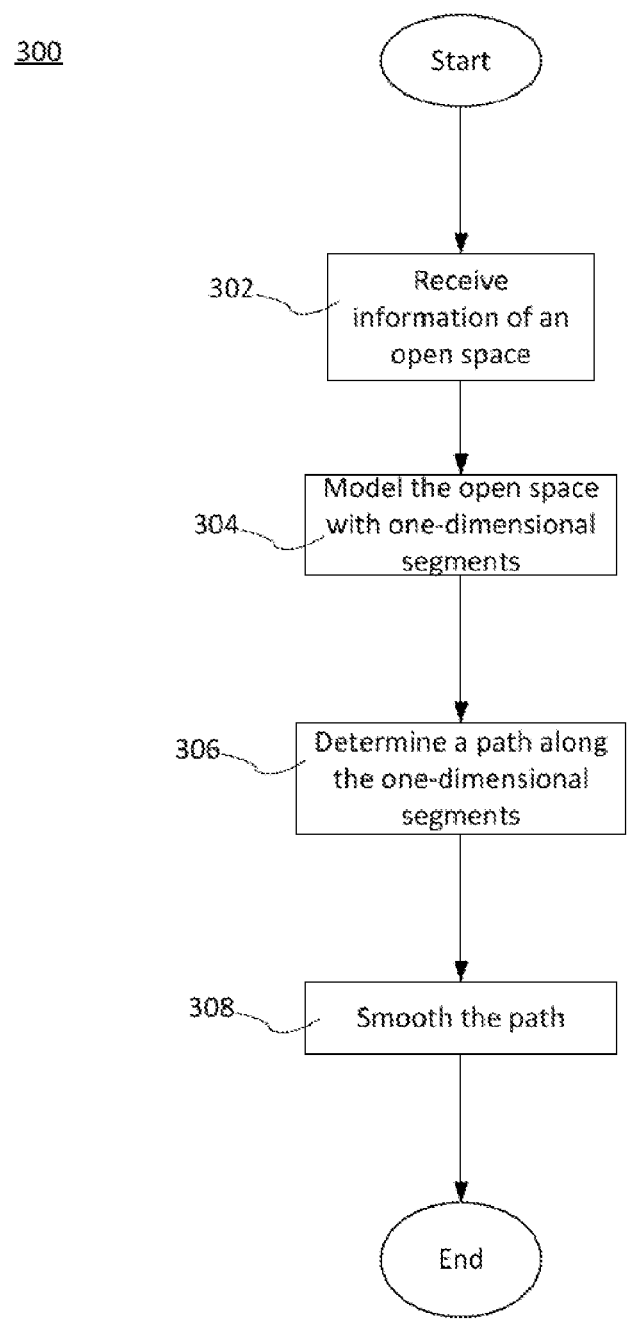
FIG. 3 is a flow diagram illustrating an example methodology for a path generator that determines a path according to aspects of the disclosure.

To generate a path of an open space, the path generator 112 may analyze information of the open space. FIG. 3 is a flow chart 300 illustrating a suitable process performed by the generator 112. Although steps discussed herein are made in reference to the generator 112, one or more of these steps may be performed by the processor 102.

At block 302, the generator 112 may receive information of an open space, e.g., a floor plan, provided by the database 110, or alternatively, provided by the memory 104. At block 304, the generator 112 may model the open space with one-dimensional segments. For instance, the generator 112 may partition the open space using partition lines, namely, one-dimensional segments, based on a geometric arrangement of one or more objects in the space. At block 306, the generator 112 may determine a path along one or more of the partition lines connecting a starting point and an ending point in the graph. At block 308, the generator 112 may smooth the path to result in a new path.

Various example embodiments of the generator 112 and its processes are discussed in more detail herein with reference to FIGS. 4-19.

Figure 4:
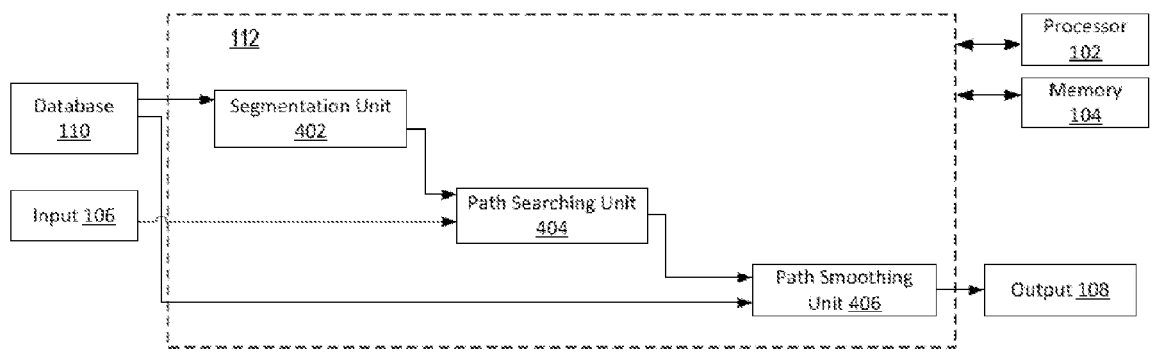
FIG. 4 is a block diagram of an example configuration of the path generator.

FIG. 4 is a block diagram 400 illustrating an example configuration of the generator 112. In some embodiments, the generator 112 may include one or more of the following components: a segmentation unit 402, a path searching unit 404, and a path smoothing unit 406. One or more of these units 402-406 may be in communication with the graph database 110 to obtain a graph representing an open space. One or more of these units may communicate with a user via the input device 106 and the output device 108, such that one or more of these units may receive and act upon user instructions, provide response to the user thereafter. Example operations with respect to each unit are as follows.

The segmentation unit 402 may model a two-dimensional open space with one-dimensional segments. Specifically, the segmentation unit 402 may partition the open space using partition lines, namely, one-dimensional segments, based on the geometric arrangement of one or more objects in the open space.

Figure 5:
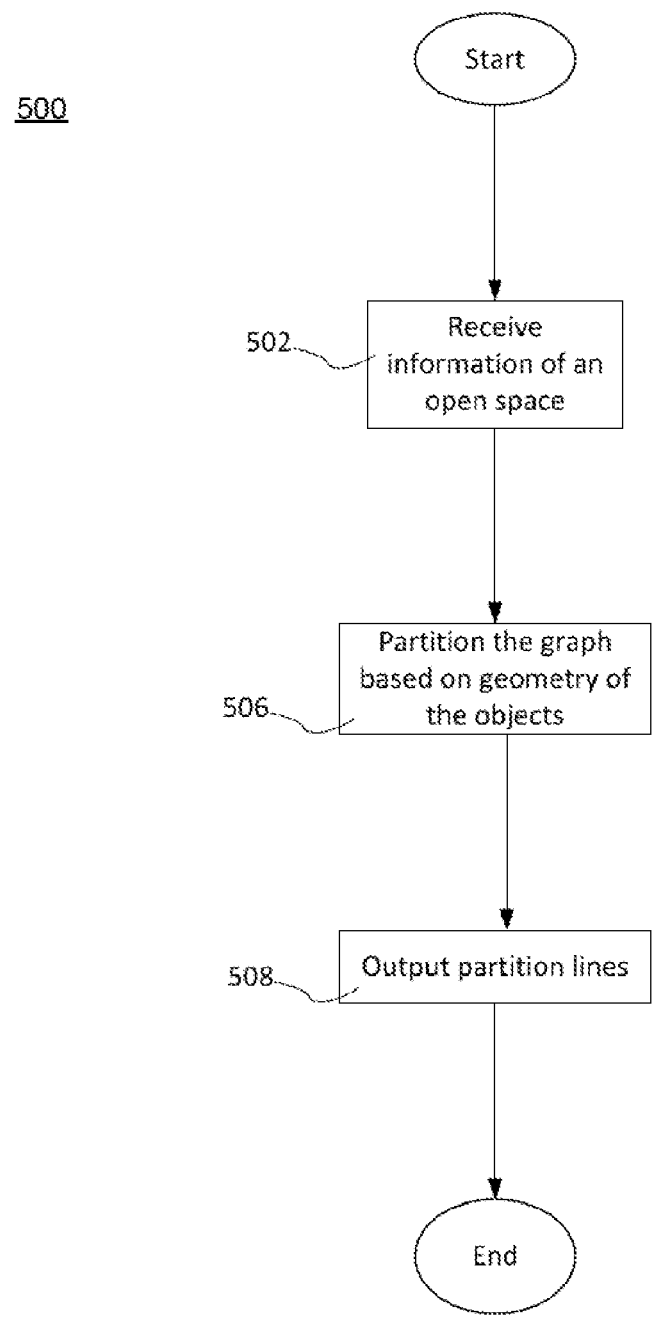
FIG. 5 is a flow diagram illustrating an example methodology for a segmentation unit of FIG. 4.

FIG. 5 is a flow chart 500 illustrating a suitable process performed by the segmentation unit 402 to partition an open space. At block 502, the unit 402 may receive information of an open space, e.g., a floor plan as illustrated in FIG. 2.

Thereafter, at block 506, the unit 402 may partition the open space for instance by using the Voronoi algorithm. Specifically, the unit 402 may programmatically compute a medial axis in a space between each pair of adjacent obstacles. The medial axis may be chosen based on the geometry of the obstacles. The unit 402 may generate a partition line along each medial axis to divide the graph into multiple sections, where each section containing at least one obstacle. In one aspect, the partition lines may not extend through any obstacle.

Figure 6:
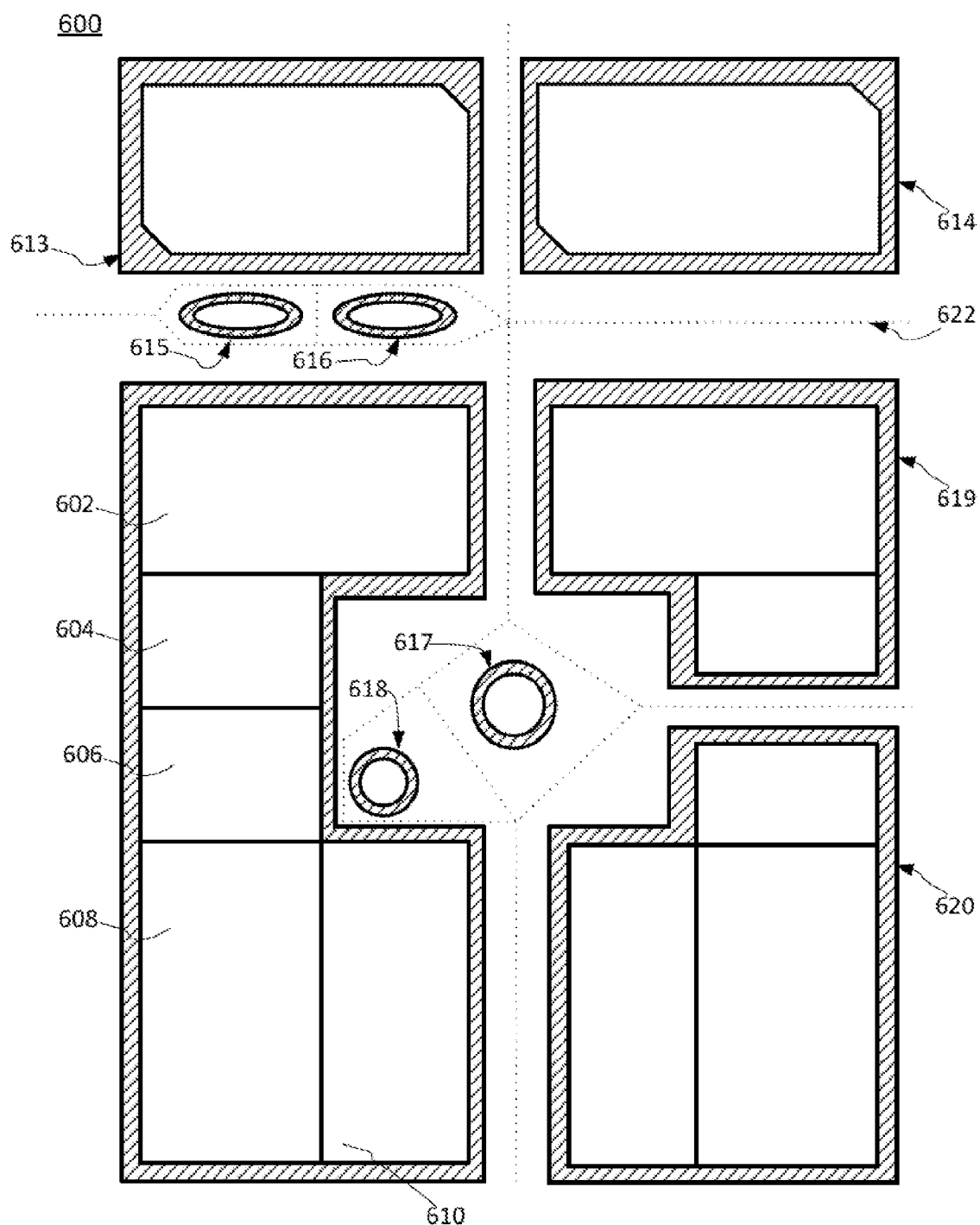
FIG. 6 is a block diagram illustrating partitioning of the floor plan of FIG. 2.
Figure 7:
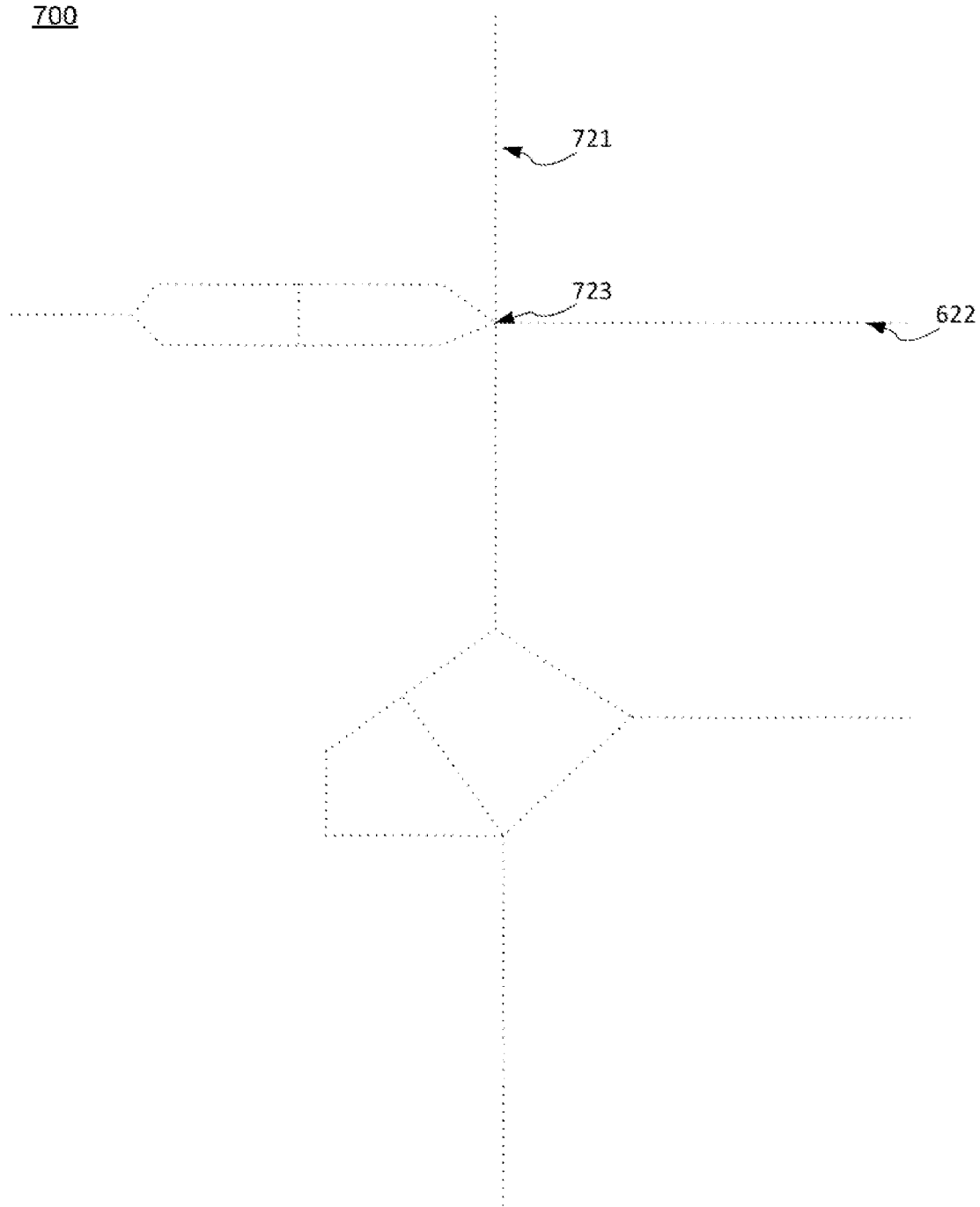
FIG. 7 is a block diagram of partition lines generated by a segmentation unit.

FIG. 6 is an example floor plan 600 with partition lines 622 illustrated therein that divide the floor plan into various sections, with each section including one or more of the obstacles 602-620. As shown in FIG. 6, the partition lines 622 may model the topology of the open space, and may model the connectivity of various parts of the open space. The partition lines 622 may capture various ways a user can maneuver between different locations in the open space to obviate obstacles. In some embodiments, the partition lines may be determined and drawn manually by human operators.

Returning back to FIG. 5, at step 508, the unit 402 may output the partition lines as the one-dimensional segments to the path searching unit 404. In one example, the unit 402 may output a graph 700 of FIG. 7, in which edges 721 represent the partition lines 622, and nodes 723 represent intersections between the partition lines.

Once the path searching unit 404 receives the partition lines generate by the segmentation unit 402, the path searching unit 404 may search a guide path along the partition lines connecting two points in the graph. The unit 404 may output the guide path to the path smoothing unit 406.

Figure 8:
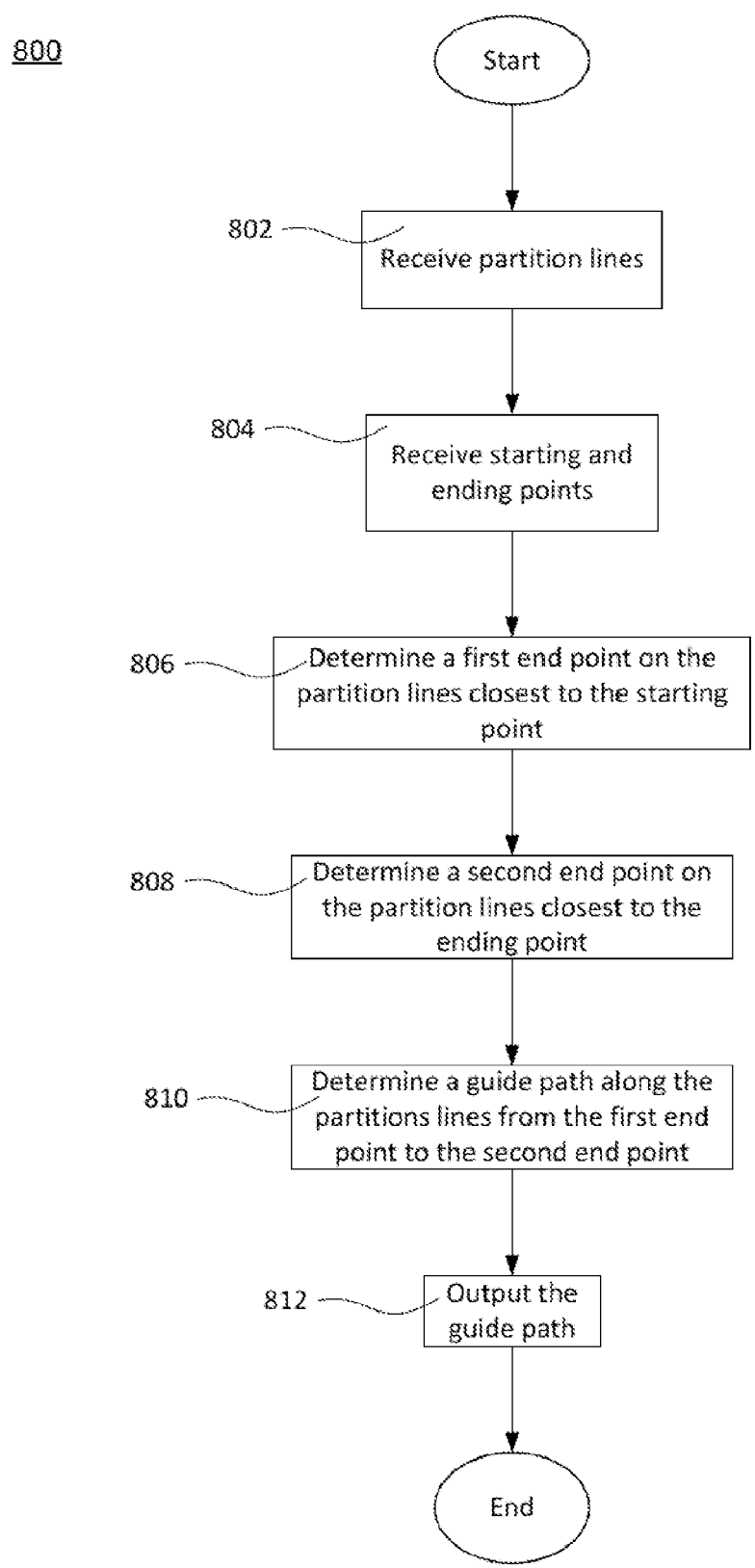
FIG. 8 is a flow diagram illustrating an example methodology for a path searching unit of FIG. 4.

FIG. 8 is a flow chart 800 illustrating a suitable process performed by the path searching unit 404 to determine a path in an open space. At block 802, the unit 404 may receive the partition lines generated by the segmentation unit 402.

Figure 9:
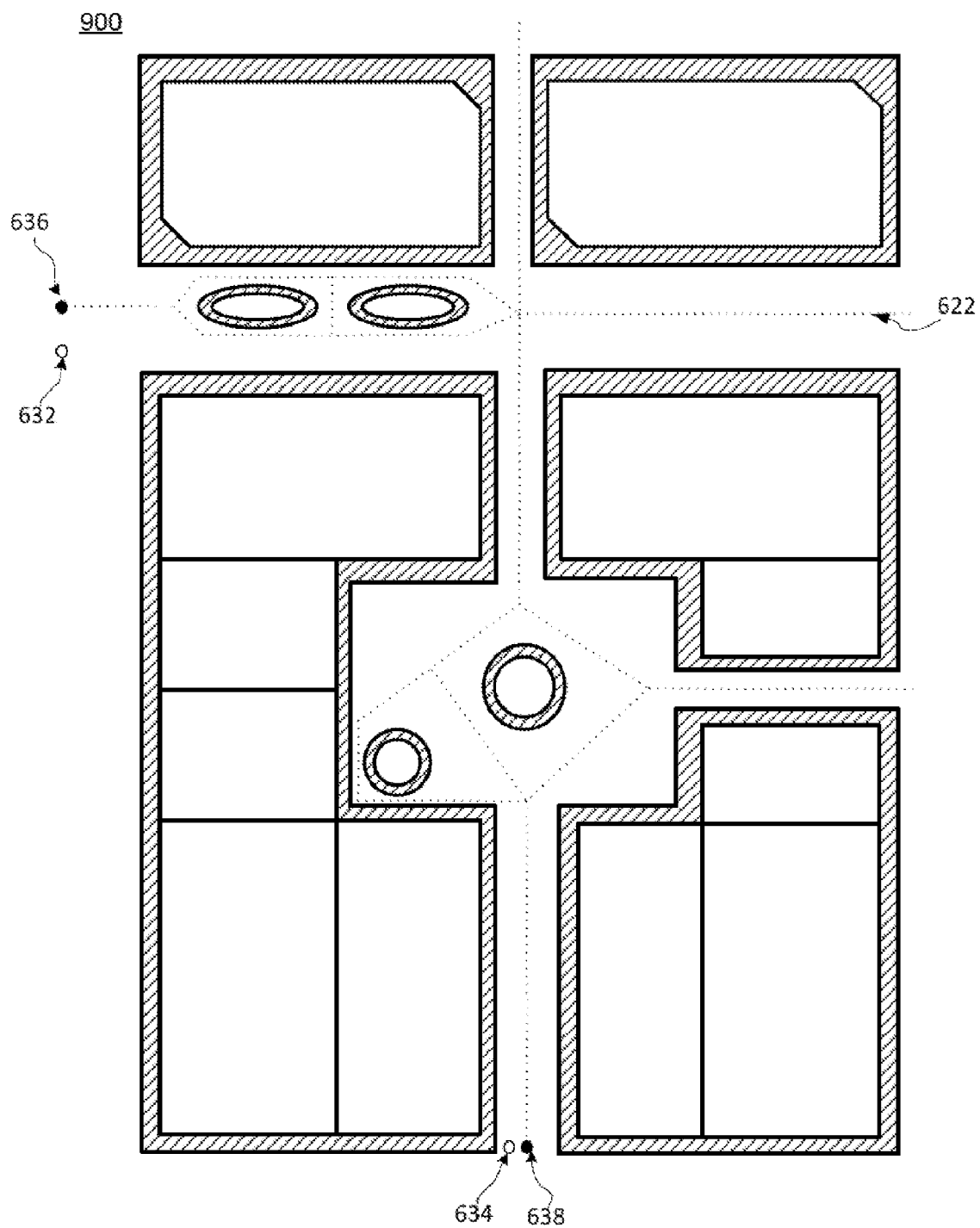
FIG. 9 is a block diagram illustrating a first and second end point along partition lines of FIG. 6.

At block 804, the path searching unit 404 may receive a starting and ending points in the open space, e.g., points 632 and 634 of block diagram 900 of FIG. 9, respectively. The unit 404 may receive a request for direction from the starting point to the ending point submitted by a user via the input device 106. Alternatively, the starting point may represent the user's present location, which may be automatically determined by a location sensor, including but not limited to a Global Positioning System (GPS) sensor. The unit 402 may receive the request for direction to an ending point submitted by the user. In some embodiments, the unit 404 may receive entries of the starting and ending points from another component or part of the system 100, or from another device that is electrically communicated with the system 100.

Next, referring back to FIG. 8 at block 806, the unit 404 may determine a first end point on the partition lines that is closest to the starting point. If the starting point falls on the partition lines, the first end point would coincide with the starting point. Otherwise, the first end point would be determined by drawing a line extending from the starting point perpendicular to the partition lines, and characterizing the intersecting point between the perpendicular line and the partition lines as the first end point. Similarly, at block 808, the unit 404 may determine a second end point on the partition lines that is closest to the ending point. For example, as illustrated in FIG. 9, the unit 402 locates the first end point 636 and the second end point 638 as the points on the partition lines 622 that are closest to the starting point 632 and the ending point 634, respectively.

Figure 10:
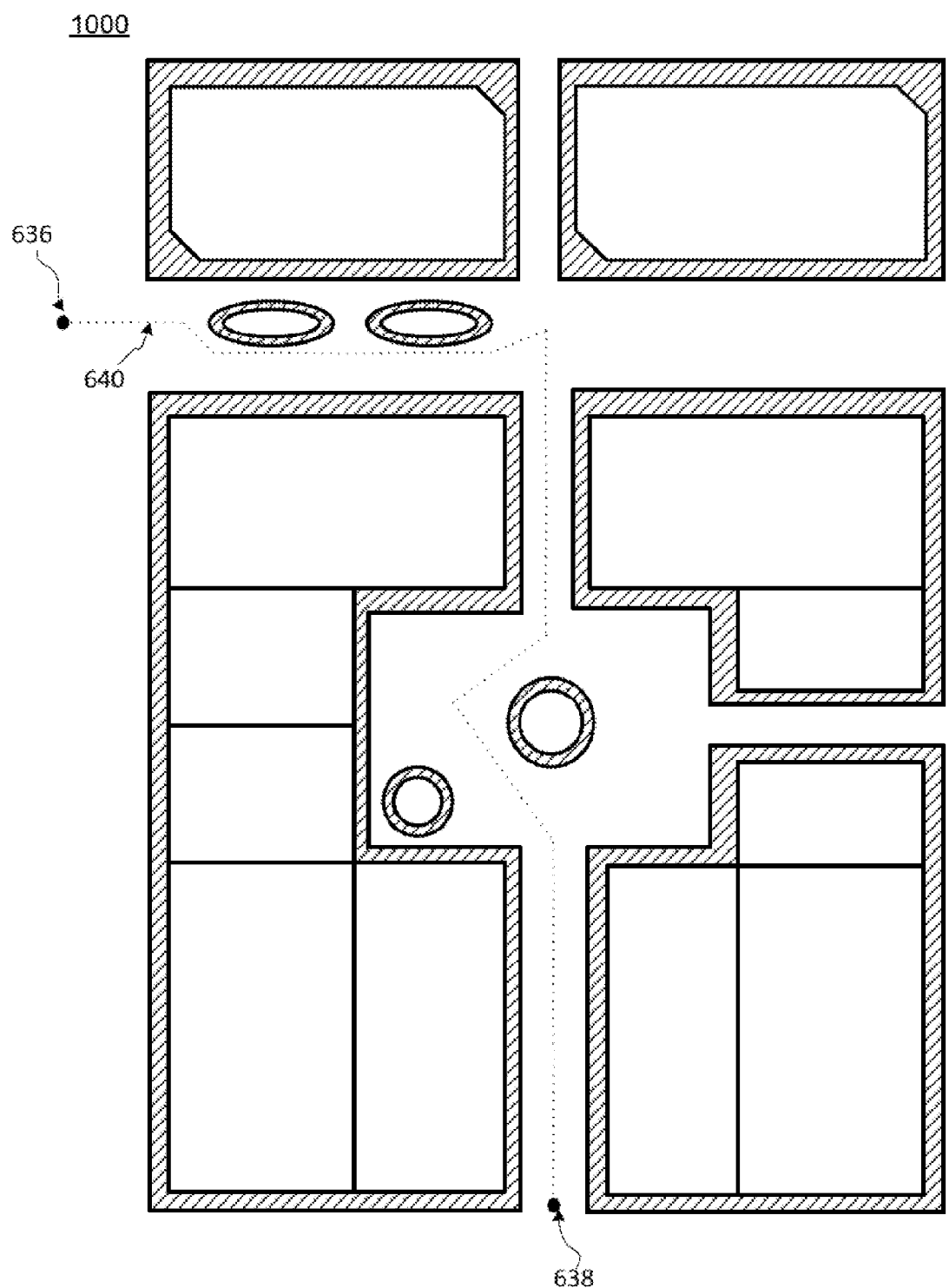
FIG. 10. is a block diagram illustrating a guide path connecting the first and second path along partition lines of FIG. 9.

Thereafter, at block 810, the unit 404 may determine or construct a guide path along the partition lines leading from the first end point to the second end point. The guide path may be a polyline comprising one or more of the partition lines or segments thereof. As shown in block diagram 1000 of FIG. 10, the unit 404 may locate and draw a guide path 640 connecting the first and second end points 636 and 638. As seen in FIG. 10, the guide path 640 may include straight segments. The guide path 640 may serve as a rough indicator to a user of a path to be taken in the open space. However, due to the ugly, jagged or unnatural appearance of the guide path 640, a user under normal circumstances may not embark on the guide path to maneuver from the starting point to the ending point. The guide path 640, however, is amenable to high-level manipulation to result in a path more appealing to the user, more details of which is discussed later with respect to the path smoothing unit 406.

In some embodiments, the path searching unit 404 does not construct a guide path using all possible partition lines generated by the segmentation unit 402, as the guide path resulted thereof may be circular, unnecessarily long, or may simply seem odd.

In one embodiment, the path searching unit 404 may construct a guide path by determining a shortest path along the partition lines. For instance, the guide path 640 shown in FIG. 10 represents the shortest path along the partition lines connecting the first and second end points 636 and 638.

In some embodiments, the guide path generated by the path searching unit 404 may not intersect the boundary of any obstacle. However, in certain embodiments, the guide path may be completely contained within some of the obstacles.

Returning back to FIG. 8, at block 812, the path searching unit 404 may output the guide path to the path smoothing unit 406.

The path smoothing unit 406 may implement a smoothing process therein to smooth the guide path generated by the path searching unit 404. More specifically, the guide path may be relied on to generate a new path with a reduced degree of jaggedness or unnatural appearance, and with an increased degree of appeal to the user. The new path may be rendered to wrap around obstacles in the open space.

Figure 11:
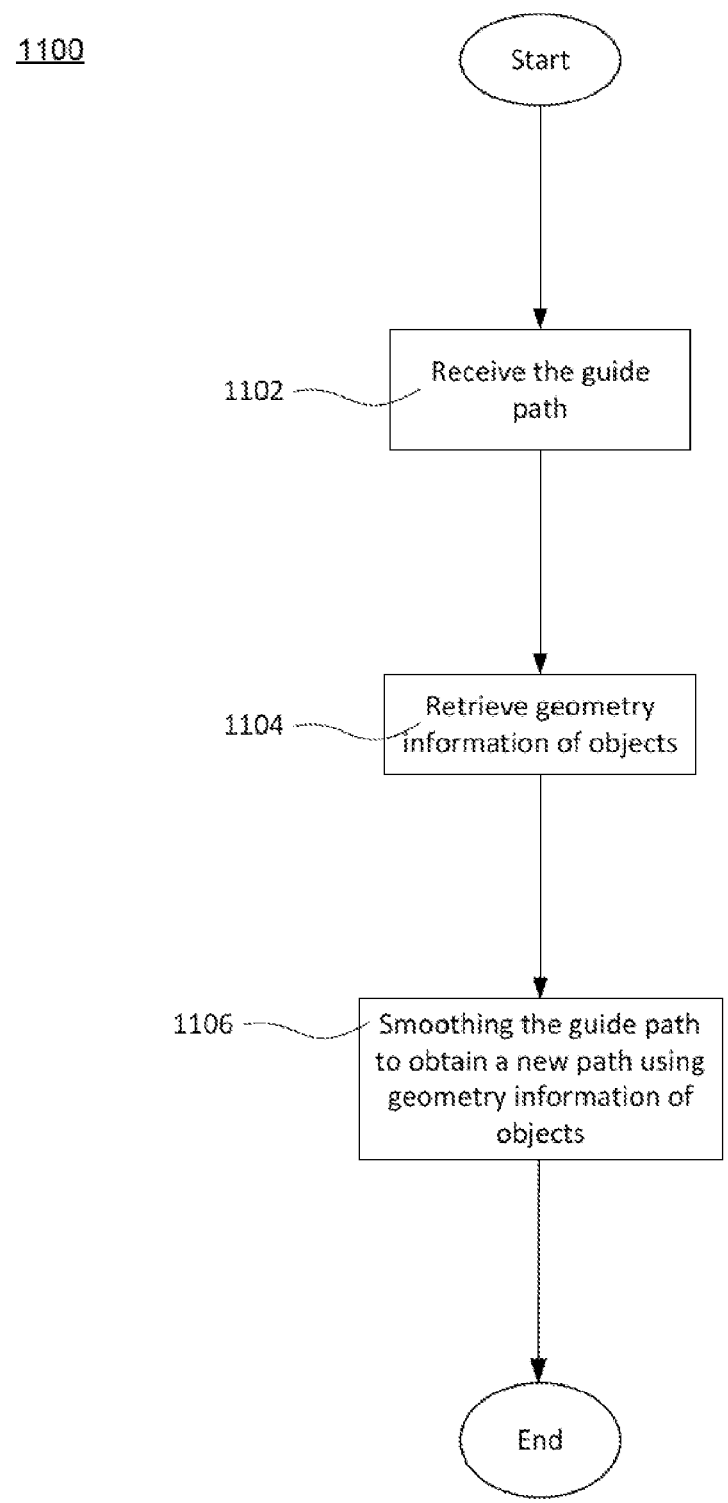
FIG. 11 is a flow diagram illustrating an example methodology for a path smoothing unit of FIG. 4.

FIG. 11 is a flow chart 1100 illustrating a suitable process performed by the path smoothing unit 406 to generate a smooth path based on the guide path. At block 1102, the unit 406 may receive the guide path generated by the path searching unit 404. At block 1104, the unit 406 may retrieve geometry information of objects of the open space. The unit 406 may obtain such information from the graph of the open space stored in the graph database 110 or the memory 104. At block 1106, the unit 406 may perform a smoothing algorithm on the guide path to generate a new path using geometry information of the objects.

The smoothing process may apply a computer graphics technique that imitates a process of pulling the guide path and results in a new path that is taut around obstacles. The smoothing process may be implemented in various ways. In one example, the smoothing process may incorporate the Cords algorithm. Details of the Cords algorithm may be found in the paper titled "Cords: Interactive Modeling of 3D Curves with Physics-Like Properties" by Patrick Coleman and Karan Singh. Here, the smoothing process may build a new path, namely, a "cord", by approximately following the guide path around the geometric arrangement of the obstacles in the open space. The cord may be a polyline that includes a plurality of line segments, the total length of which may be shorter than the guide path. The cord may not intersect any of the obstacles, thus avoiding obstacles in the open space.

Figure 12:
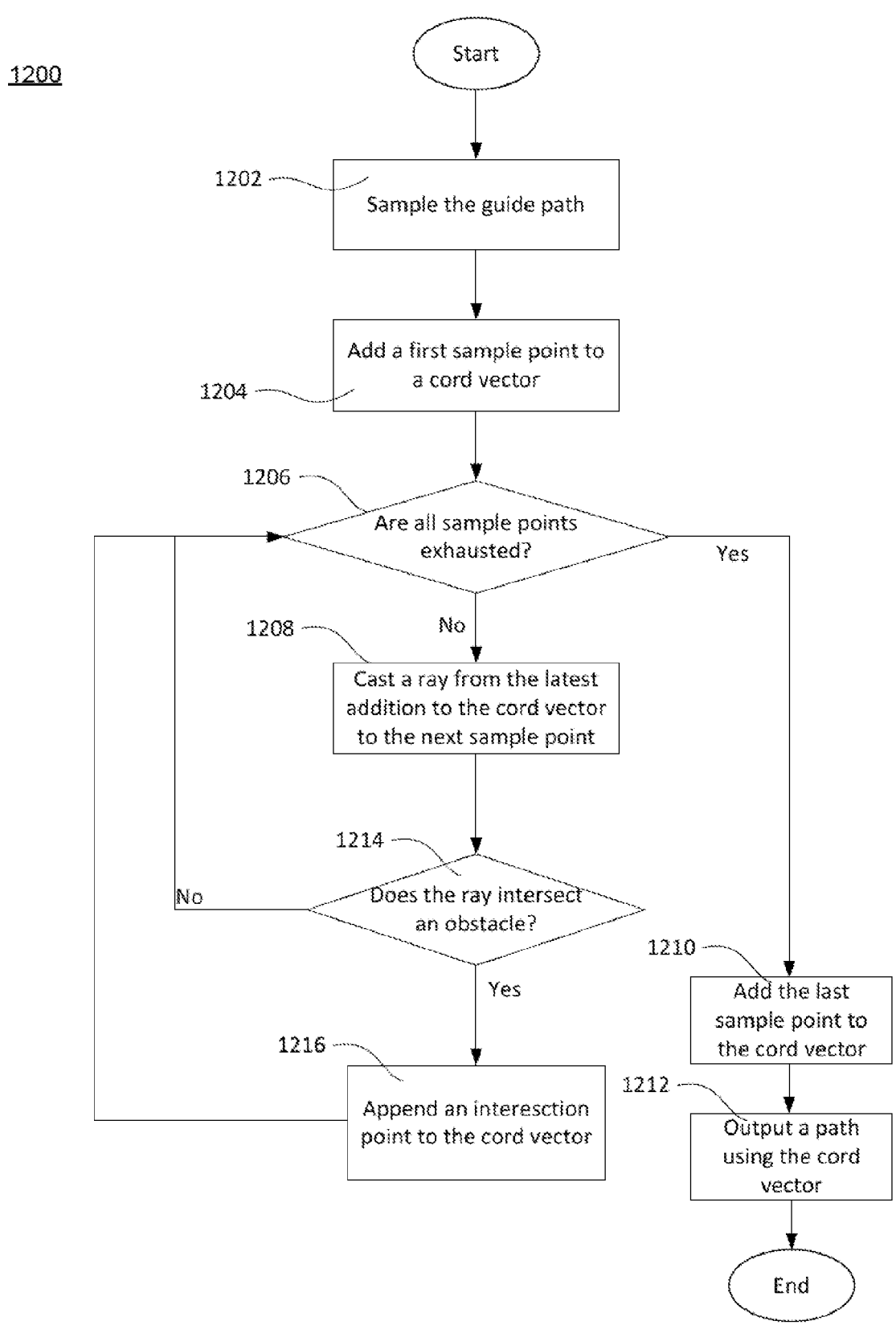
FIG. 12 is a flow diagram illustrating steps of a smoothing process according to one aspect of the disclosure.
Figure 13:
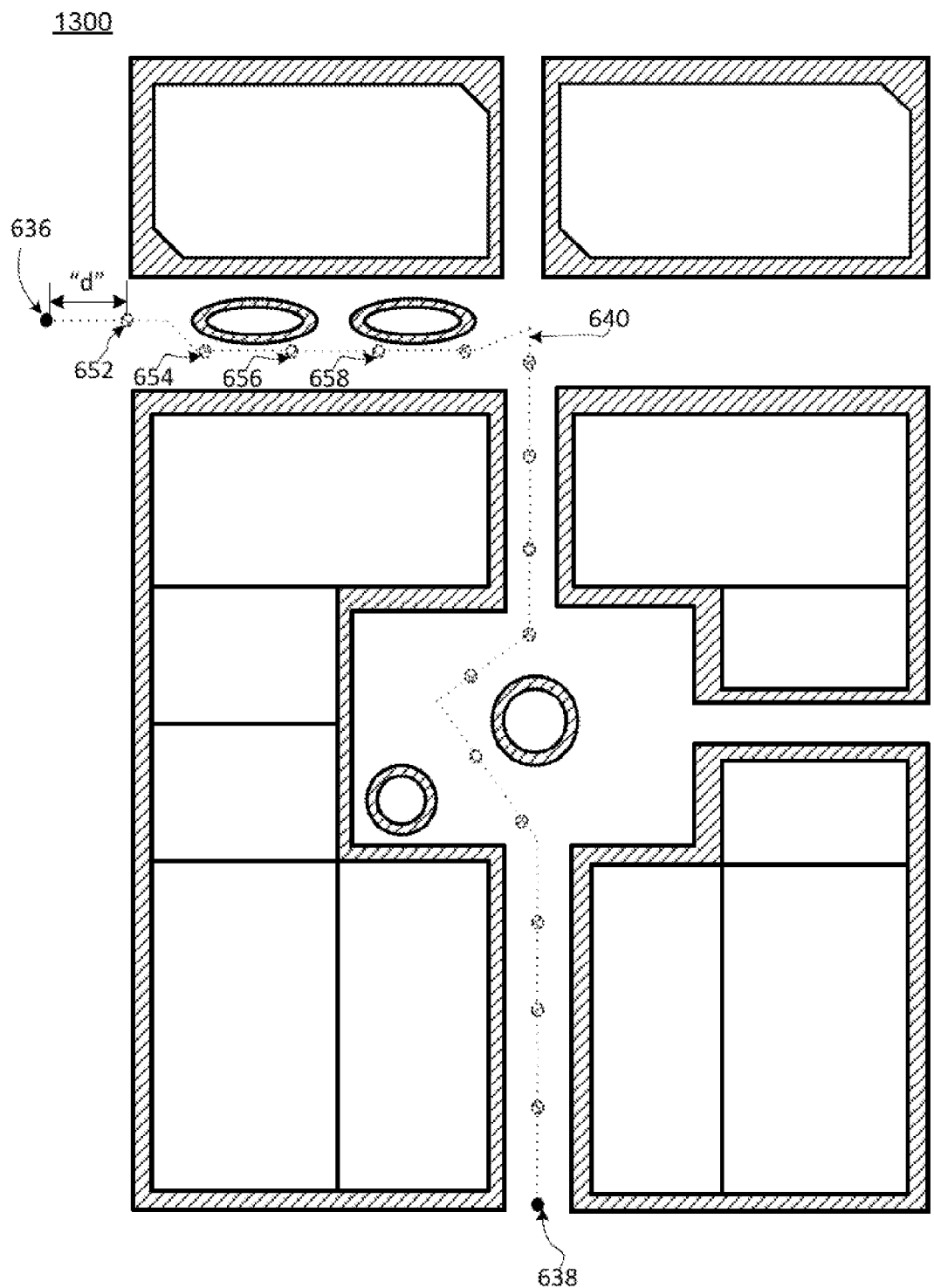
FIG. 13 is a block diagram illustrating sample points along the guide path of FIG. 10.
Figure 14:
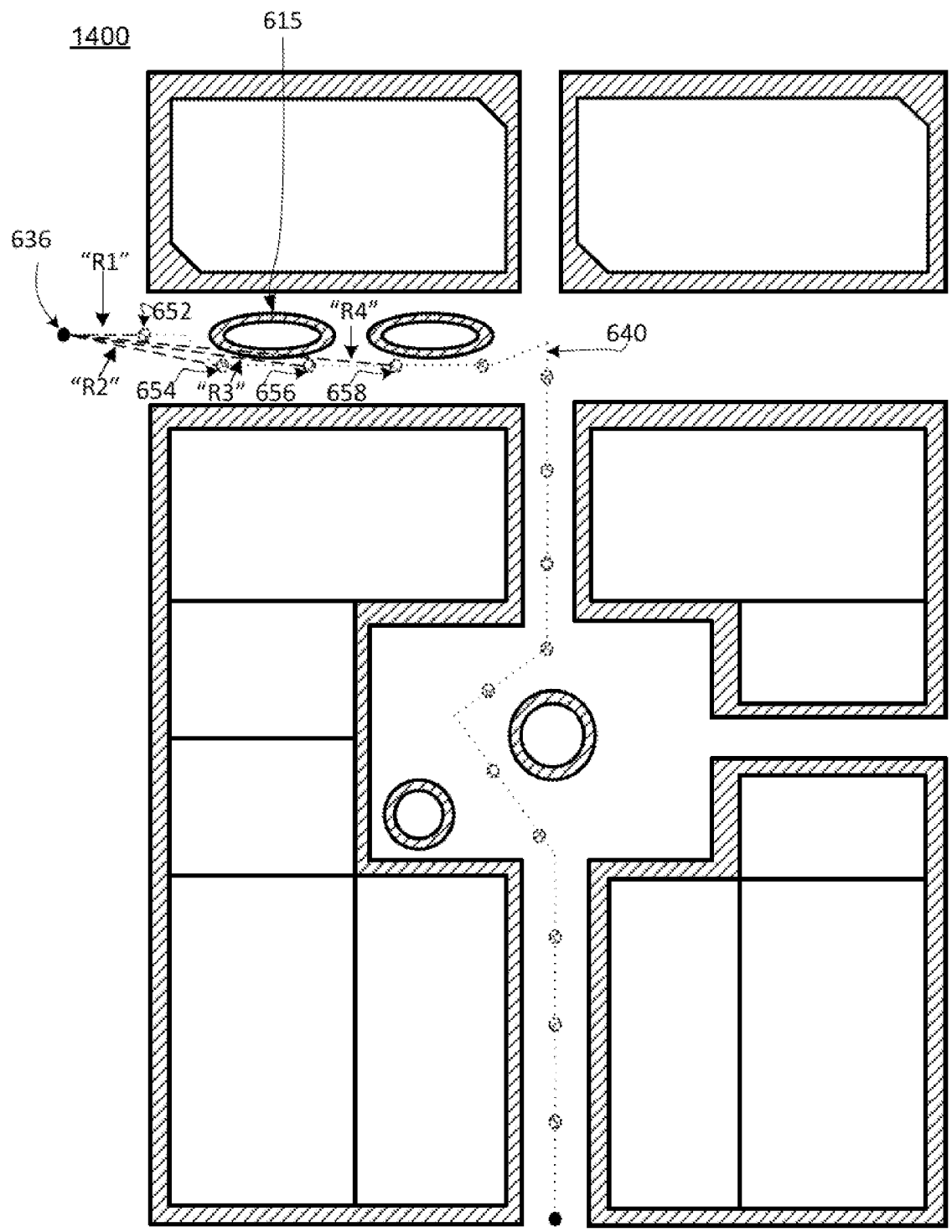
FIG. 14 is a block diagram illustrating rays directed to some of the sample points of FIG. 13.

FIG. 12 is a flow chart 1200 of the smoothing process implemented by the path smoothing unit 406. At block 1202, the unit 406 may sample the guide path on discrete intervals, or at a predetermined step size.

The step size may affect generation of the cord. As shown in block diagram 1300 of FIG. 13, a plurality of sample points, e.g., 652-658, may be created along the guide path 640 at a predetermined step size of "d." In one embodiment, the sample points may include the two end points of the guide path 640, i.e., the first end point 636 and the second end point 638. For instance, the first sample point may coincide with the first end point 636, and the last sample point may coincide with the second end point 638.

Returning back to FIG. 12, at block 1204, the path smoothing unit 406 may create a cord vector, and append thereto the first end point 636 or the first sample point of the guide path 640. Blocks 1206-1216 form a loop that iterates through all sample points of the guide path 640. At block 1206, the unit 406 may determine if all sample points on the guide path 640 have been exhausted. In other words, the unit 406 may determine if any more sample points on the guide path 640 remain to be iterated.

If all sample points on the guide path 640 have been exhausted, at block 1210, the unit 406 may add the last sample point, e.g., the second end point 638 of the guide path 640, to the cord vector. Thereafter, at block 1212, the unit 406 may generate a path, which may be a polyline that connects all points in the cord vector.

If there is one or more sample points on the guide path 640 remain to be iterated, at block 1208, the unit 406 may cast a ray from the latest addition to the cord vector to the next sample point. For instance, as shown in block diagram 1400 of FIG. 14, a ray "R1" is cast from the first end point 636 or the first sample point to the next sample point 652.

Returning back to FIG. 12, at block 1214, the unit 406 may determine if the ray intersects geometry of any obstacle. If false, the method may return back to block 1206. For instance, with regard to FIG. 14, after sequentially determining rays "R1," "R2," and "R3" do not intersect the geometry of any obstacle, the unit 406 may cast a ray "R4" to determine if it intersects the geometry of any obstacle.

If an intersection occurs, the unit 406 may, at block 1216, append an intersection point between the ray and the boundary of the obstacle to the cord vector, and may then return to block 1206. The intersection point appended to the cord vector may be determined in the following manner. First, once the unit 406 determines that a ray intersects the geometry of an obstacle, the unit 406 may determine the number of intersections between the ray and the obstacle. If more than one intersection occurs between the ray and the obstacle, the unit 406 may perform an algorithm that backtracks until it finds a ray that intersects the obstacle only once. The intersection point determined as such may then be appended to the cord vector.

Figure 15:
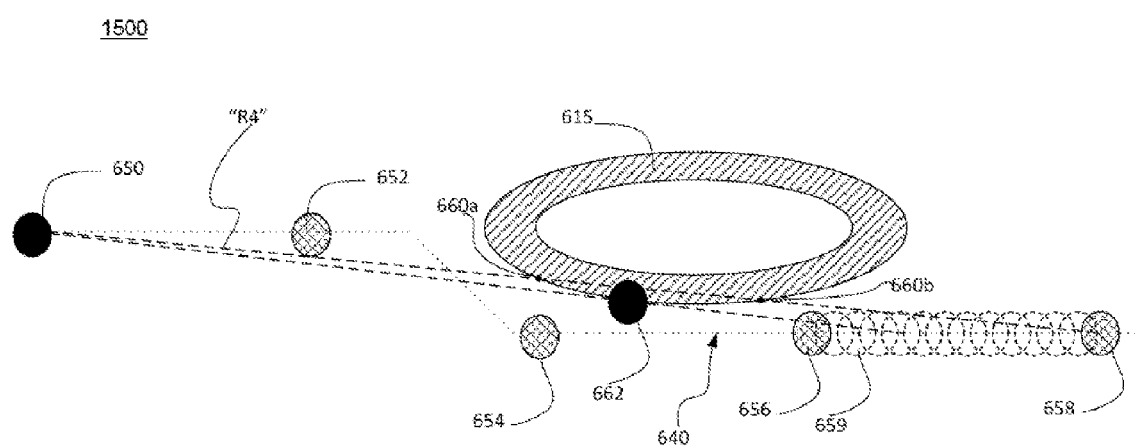
FIG. 15 is a block diagram illustrating locating an intersection between a ray and an object.

In the example illustrated in block diagram 1500 in FIG. 15, once the unit 406 determines that the ray "R4" intersects the obstacle 615 more than once, for instance, at intersection points 660a and 660b, the unit 406 may perform the backtrack algorithm. More specifically, the unit 406 may move a reference point 659 along the guide path from the current sample point 658 to the previous sample point 656. As the reference point 659 moves in such a backward fashion, the unit 406 may cast a ray from the latest addition to the cord vector, e.g., the first end point 650 or the first sample point, to the moving reference point 659 until the cast ray intersects the obstacle 615 only once. For instance, if the obstacle defines a curved boundary, then the reference point 659 may be moved along the guide path 640 from the current sample point to the previous sample point until a cast ray forms a tangent line with respect to a point 662 along an edge of the obstacle 615. The unit 406 may then add this intersection point 662 to the cord vector.

According to the example smoothing process discussed herein, the first end point 650 on the guide path 640 and the intersecting point 662, along an edge of the obstacle 615 forms a first segment of the smooth or new path. A subsequent segment of the smooth path is determined in a similar manner, where the intersecting point 662, along the edge of the obstacle 615 that is recently added to the cord vector becomes the new originate point for casting a ray according to block 1208 of FIG. 12.

In one embodiment, the step size of sampling the guide path or the interval of the sampling may be small enough such that no obstacles fall completely in a triangle formed by a last addition to the cord vector and two consecutive sample points.

Figure 16:
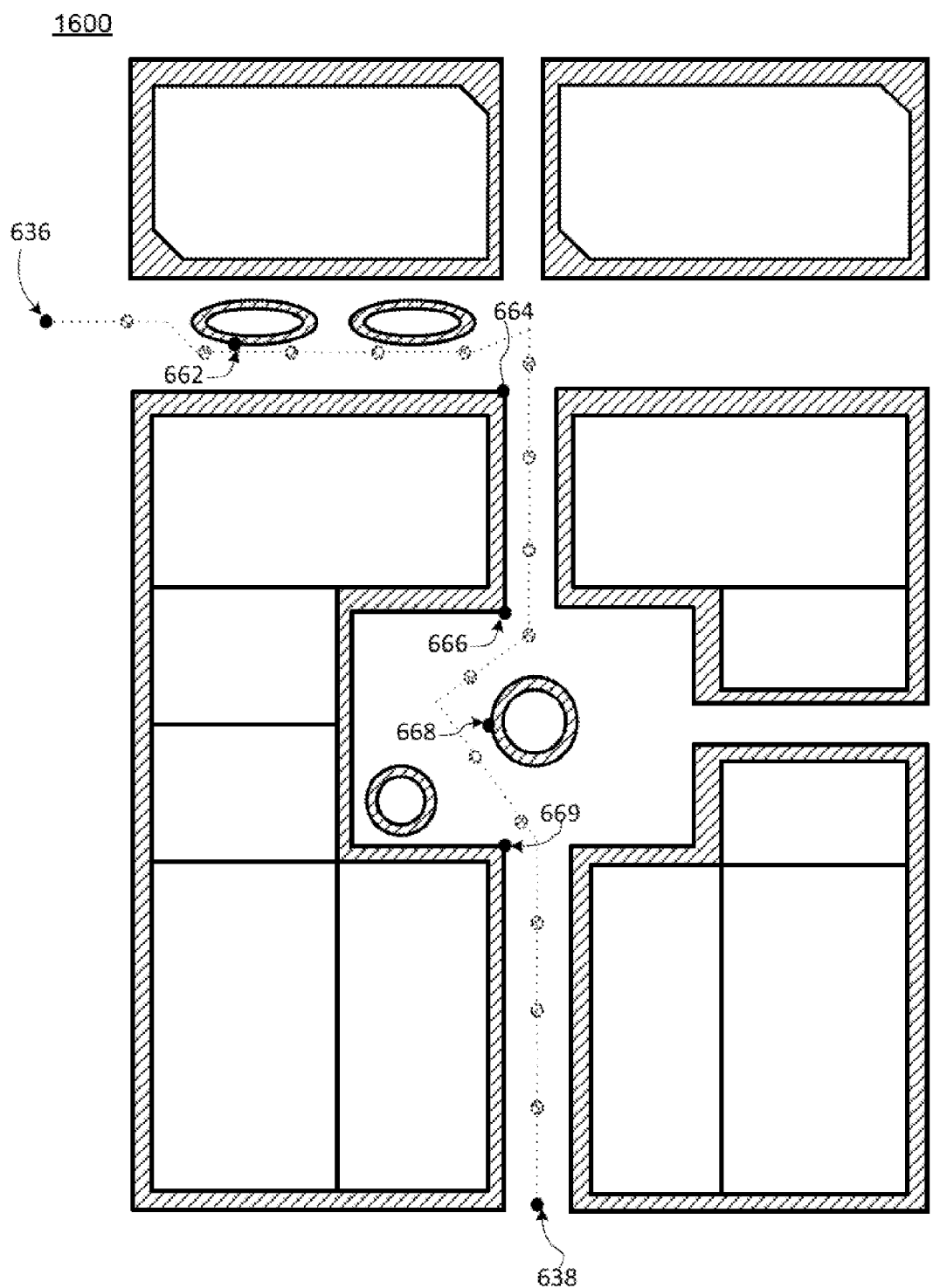
FIG. 16 is a block diagram illustrating points stored in a cord vector.
Figure 17:
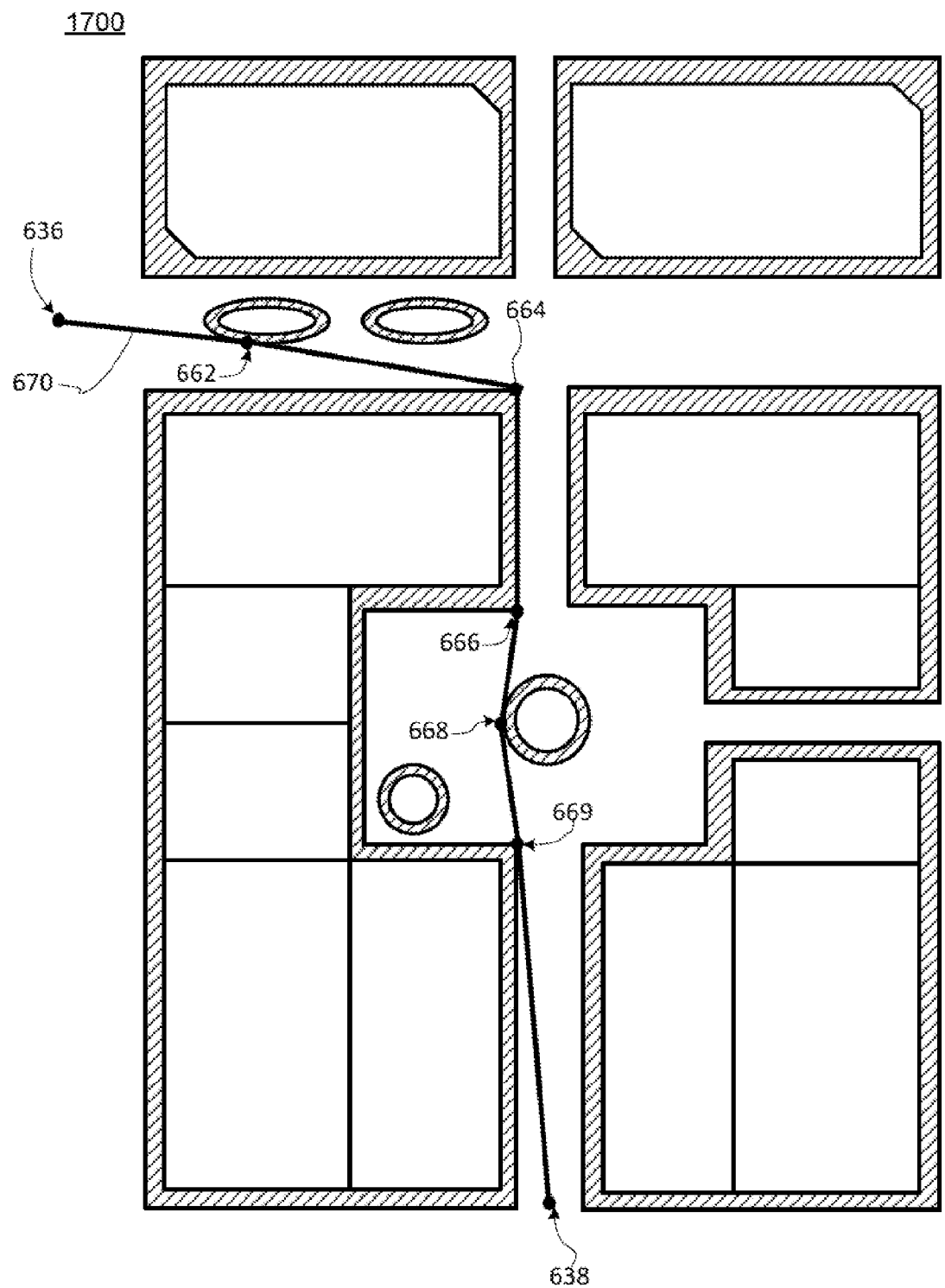
FIG. 17 is a block diagram illustrating generating a smooth path connecting points of the cord vector of FIG. 16.

FIG. 16 is an example illustration 1600 of all points 636, 638, and 662-669 added to the cord vector according to the smoothing algorithm described above. Based on the cord vector, the path smoothing unit 406 may generate a smooth path that sequentially connects all points in the cord vector. FIG. 17 is an example illustration 1700 of the smooth path 670 generated by the path smoothing unit 406.

Although the technology herein has been described with reference to particular embodiments, it is to be understood that these embodiments are merely illustrative of the principles and applications of the present invention. It is therefore understood that numerous modifications may be made to the illustrative embodiments and that other arrangements may be devised without departing from the spirit and scope of the present disclosure as defined by the appended claims.

The invention claimed is:

1. A method comprising:
receiving information of an open space;
determining, by one or more processors, a first path along partition lines connecting between a first point and a second point in the open space, the partition lines being boundaries between adjacent objects in the open space;
creating, by the one or more processors, a plurality of sample points along the first path, including a first sample point associated with the first point in the open space and a last sample point associated with the second point in the open space;
smoothing the first path to reduce jaggedness in the first path by creating, using the one or more processors, a list of path points representing a second path that includes a plurality of path points fewer than the plurality of sample points along the first path, wherein the list of path points is created by:
adding the first sample point to the list as a first path point,
casting a ray from the first path point to each of the plurality of sample points along the first path in a descending order of distance from the first path point until the ray intersects with at least one object,
changing a direction of the ray until the ray intersects with the one object only once at an intersection point,
adding the intersection point as a second path point to the list, and
adding the last sample point to the list as a last path point; and
providing for display, by the one or more processors, the second path by sequentially connecting all the path points in the list.

2. The method of claim 1, wherein the intersection point is a first intersection point, and the list of path points is further created by:
casting a second ray from the second path point added to the list to each of the plurality of sample points on the first path between the second path point and the last sample point in a descending order of distance from the second path point until the second ray intersects with at least a second object;
changing a direction of the second ray until the ray intersects with the second object only once at a second intersection point; and
adding the second intersection point as a third path point to the list.

3. The method of claim 1, wherein each object is an obstacle in the open space.

4. The method of claim 1, wherein the first path and the second path are unobstructed by the objects in the open space.

5. The method of claim 1, wherein the open space is not defined by a walking infrastructure.

6. The method of claim 1, wherein the plurality of sample points are a predetermined interval apart.

7. The method of claim 6, wherein the predetermined interval is small enough such the at least one object does not fall completely in a triangle formed by one sample point and any two sample points neighboring the one sample point.

8. The method of claim 1, wherein the second path is a polyline that connects all path points in the list of path points.

9. The method of claim 2, wherein creating the list of path points representing the second path comprises:
determining a number of intersections between the ray and the at least one object;
wherein, if the number of intersections is more than one, the direction of the ray is changed by rotating the ray about the first path point towards the first path point until the ray intersects with the one object only once at an intersection point.

10. A system comprising:
a memory storing information of an open space; and
one or more processors in communication with the memory, the one or more processors configured to:
determine a first path along partition lines connecting between first and second points in the open space, the partition lines being boundaries between adjacent objects in the open space;
create a plurality of sample points along the first path, including a first sample point associated with the first point in the open space and a last sample point associated with the second point in the open space;
smooth the first path to reduce jaggedness in the first path by creating a list of path points representing a second path that includes a plurality of path points fewer than the plurality of sample points along the first path, wherein the list of path points is created by:
adding the first sample point to the list as a first path point,
casting a ray from the first path point to each of the plurality of sample points along the first path in a descending order of distance from the first path point until the ray intersects with at least one object, and
adding the last sample point to the list as a last path point; and
provide for display a second path by sequentially connecting all the path points in the list to represent the second path.

11. The system of claim 10, wherein the one or more processors are further configured to retrieve geometry information of the objects in the open space.

12. The system of claim 10, wherein each object is an obstacle in the open space.

13. The system of claim 10, wherein the first path and the second path are unobstructed by the objects in the open space.

14. The system of claim 10, wherein the open space is not defined by a walking infrastructure.

15. The system of claim 10, wherein the plurality of sample points are a predetermined interval apart.

16. The system of claim 15, wherein the predetermined interval is small enough such the at least one object does not fall completely in a triangle formed by one sample point and any two sample points neighboring the one sample point.

17. The system of claim 10, wherein the second path is a polyline that connects all path points in the list of path points.

18. The system of claim 10, wherein the one or more processors are further configured to create the list of path points representing the second path by:
   determining a number of intersections between the ray and the at least one object;
   wherein, if the number of intersections is more than one, a direction of the ray is changed by rotating the ray about the first path point towards the first path point until the ray intersects with the one object only once at an intersection point.

19. A non-transitory, tangible machine-readable medium on which instructions are stored, the instructions, when executed by one or more processors, cause the one or more processors to perform a method, the method comprising:
   receiving information of an open space;
   determining a first path along partition lines connecting between a first point and a second point in the open space, the partition lines being boundaries between adjacent objects in the open space;
   creating a plurality of sample points along the first path, including a first sample point associated with the first point in the open space and a last sample point associated with the second point in the open space;
   smoothing the first path to reduce jaggedness in the first path by creating a list of path points representing a second path that includes a plurality of path points fewer than the plurality of sample points along the first path, wherein the list of path points is created by:
      adding the first sample point to the list as a first path point,
      casting a ray from the first path point to each of the plurality of sample points along the first path in a descending order of distance from the first path point until the ray intersects with at least one object, and
      adding the last sample point to the list as a last path point; and
   providing for display a second path by sequentially connect all the path points in the list.

20. The medium of claim 19, wherein the second path is a polyline that connects all path points in the list of path points.

* * * * *